US007521964B1

(12) United States Patent
Luo et al.

(10) Patent No.: US 7,521,964 B1
(45) Date of Patent: Apr. 21, 2009

(54) HIGH-SPEED LEVEL-SHIFTING CIRCUIT

(75) Inventors: Mei Luo, San Jose, CA (US); Vinh Van Ho, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/691,106

(22) Filed: Mar. 26, 2007

(51) Int. Cl.
*H03K 19/0175* (2006.01)
(52) U.S. Cl. .............................. 326/68; 326/81; 326/115
(58) Field of Classification Search .................. 326/63, 326/68, 81, 115; 327/333
See application file for complete search history.

(56) References Cited

U.S. PATENT DOCUMENTS

| | | | |
|---|---|---|---|
| 6,028,449 A * | 2/2000 | Schmitt ........................ | 326/80 |
| 6,433,579 B1 * | 8/2002 | Wang et al. .................... | 326/38 |
| 6,842,043 B1 * | 1/2005 | Nguyen et al. ................. | 326/68 |
| 7,088,167 B2 * | 8/2006 | Itoh ............................. | 327/333 |
| 7,180,329 B1 * | 2/2007 | Sia et al. ........................ | 326/81 |
| 7,224,202 B2 * | 5/2007 | Pauletti ....................... | 327/333 |
| 7,265,586 B1 * | 9/2007 | Zhou et al. .................... | 326/83 |
| 7,271,639 B2 * | 9/2007 | Satou et al. .................. | 327/333 |
| 7,274,209 B1 * | 9/2007 | Reinschmidt ................ | 326/38 |

* cited by examiner

*Primary Examiner*—Vibol Tan
(74) *Attorney, Agent, or Firm*—Ropes & Gray LLP; Jeffrey H. Ingerman

(57) ABSTRACT

In level-shifting circuitry for shifting low-voltage-domain signals to a high-voltage domain, one of two output transistors is driven with one of the low-voltage-domain signals, thereby reducing loading on the output and increasing output speed and bandwidth. The circuitry can be mirrored for differential operation. When included in a serial interface of a programmable logic device, the circuitry can be programmably selectable between single-ended and differential operation.

28 Claims, 6 Drawing Sheets

HIGH-SPEED LEVEL-SHIFTING CIRCUIT

BACKGROUND OF THE INVENTION

This invention relates to a high-speed level-shifting circuit for use in propagation of signals between a low-power-level domain and a high-power-level domain, especially in a serial interface of a programmable logic device (PLD), in which the levels may be different from one user application to another.

It has become common for PLDs to incorporate high-speed serial interfaces to accommodate serial input/output (I/O) standards, which may be single-ended or differential. Frequently, in such interfaces, a signal propagates between a digital domain and an analog domain. In general, a digital domain has a relatively low-voltage power supply, while an analog domain has a relatively high-voltage power supply. The signal is converted from low-voltage to high-voltage when it travels from the digital domain to the analog domain.

For this purpose, a level-shifting circuit that can be used in high-speed applications is known. However, the known level-shifting circuit has a bottleneck that limits the effective speed or bandwidth at which it can used.

It would be desirable to be able to provide a high-speed level-shifting circuit that is less limited in speed or bandwidth. In addition, many serial protocols are differential, and therefore it would be desirable for the high-speed level-shifting circuit to work with differential signals as well as single-ended signals.

SUMMARY OF THE INVENTION

The present invention takes advantage of the nature of thin-gate-oxide transistors as compared to thick-gate-oxide transistors. In level-shifting circuitry, the low-power domain generally includes thin-gate-oxide devices while the high-power domain includes thick-gate-oxide devices. By driving one of two output transistors with one of the low-power-domain signals, the loading on the output is reduced, increasing output speed and bandwidth. The circuitry can be mirrored for differential operation.

Thus, in accordance with the present invention there is provided a level-shifting circuit for accepting an input signal at a first power-supply level and providing that input signal as an output signal at a second power-supply level higher than the first power-supply level. The level-shifting circuit includes a first power supply at the first power-supply level, and a second power supply at the second power-supply level. A first complementary transistor pair is arranged as an inverter between the first power supply and ground, accepting as an input the input signal, and providing as a first intermediate signal the input signal inverted. A second complementary transistor pair is connected in source-to-drain configuration between the second power supply and the first intermediate signal. A first transistor of the second complementary transistor pair is gated by a reference signal and a second transistor of the second complementary transistor pair is gated by the input signal. The second complementary transistor pair provide a second intermediate output at their common connection. A third complementary transistor pair is arranged as an inverter between the second power supply and ground, a first transistor of the third complementary transistor pair being gated by the first intermediate signal and a second transistor of the third complementary transistor pair being gated by the second intermediate signal. The third complementary transistor pair provide the output signal at their common connection.

A serial interface incorporating the level-shifting circuitry, and a programmable logic device incorporating that serial interface, also are provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION

As described above, according to the present invention the speed and bandwidth of a level-shifting circuit preferably is increased by reducing the loading on a signal which is a bottleneck in previously known level-shifting circuits.

The invention will now be described with reference to FIGS. 1-7.

Figure 1:
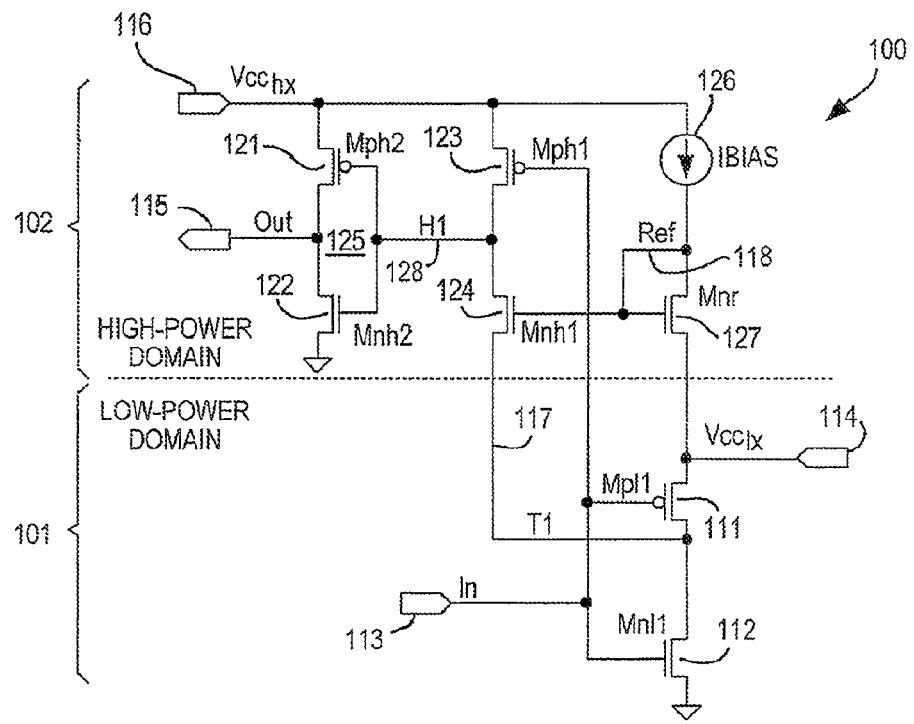
FIG. 1 is a schematic diagram of a previously known level-shifting circuit.

FIG. 1 shows a known level-shifting circuit 100. Transistors 111, 112 in low-power domain 101 are thin-oxide devices, while transistors 121, 122, 123, 124 in high-power domain 102 are thick-oxide devices. Circuit 100 is used to convert an input signal 113 ("In") at a low power level 114 ($V_{CClx}$) to an output signal 115 ("Out") at a high power level 116 ($V_{CChx}$) through a current mirror/inverter arrangement. When input signal "In" 113 in the low-voltage domain switches from low to high, signal 117 ("T1") is discharged through transistor 112 ("Mnl1") to ground. Bias signal 118 ("Ref") in the high-voltage domain turns on transistor 124 ("Mnh1") to make signal 128 ("H1") in the high-voltage domain follow signal 117 ("T1") faster. Similarly, when input signal "In" 113 in the low-voltage domain switches from high to low, transistor 123 ("Mph1") pulls signal 128 ("H1") to $V_{CChx}$. Last stage inverter 125, including transistors 121, 122 ("Mph2 and "Mnh2"), amplifies signal 128 ("H1") to generate a stronger output signal 115 ("Out") to drive analog circuitry (not shown).

Thin oxide devices are faster than thick oxide devices because they have lower Vt and higher $I_{d_{sat}}$. In addition, the longer channel length of a thick oxide device causes relatively heavy loading for its driving gate. As a result, signal 128 ("H1") is a bottleneck in circuit 100, because it is driven by a thick oxide inverter and its load also is a thick oxide inverter.

Figure 2:
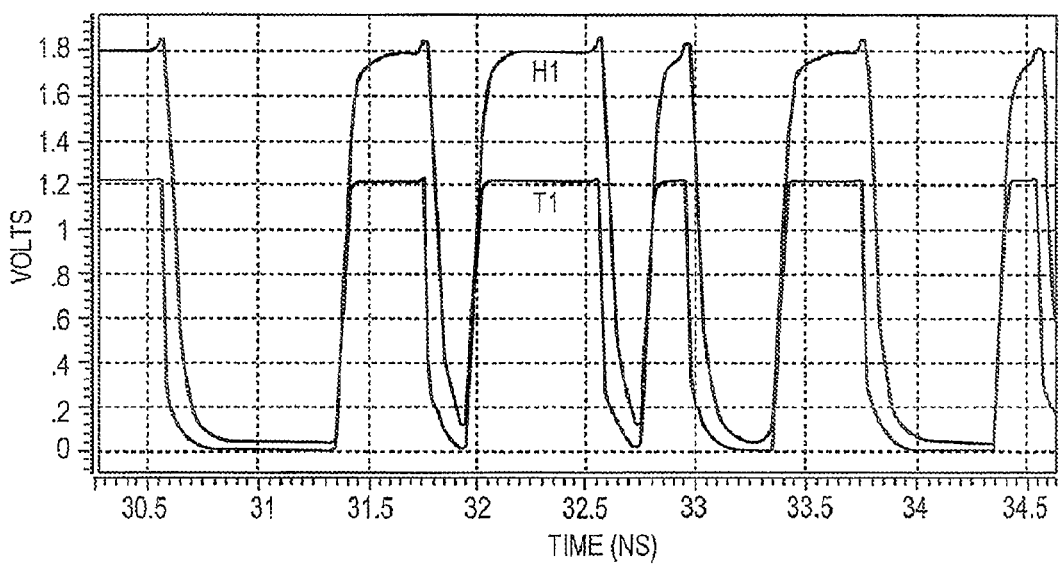
FIG. 2 is a representation of the waveforms of two signals in the circuit of FIG. 1.
Figure 3:
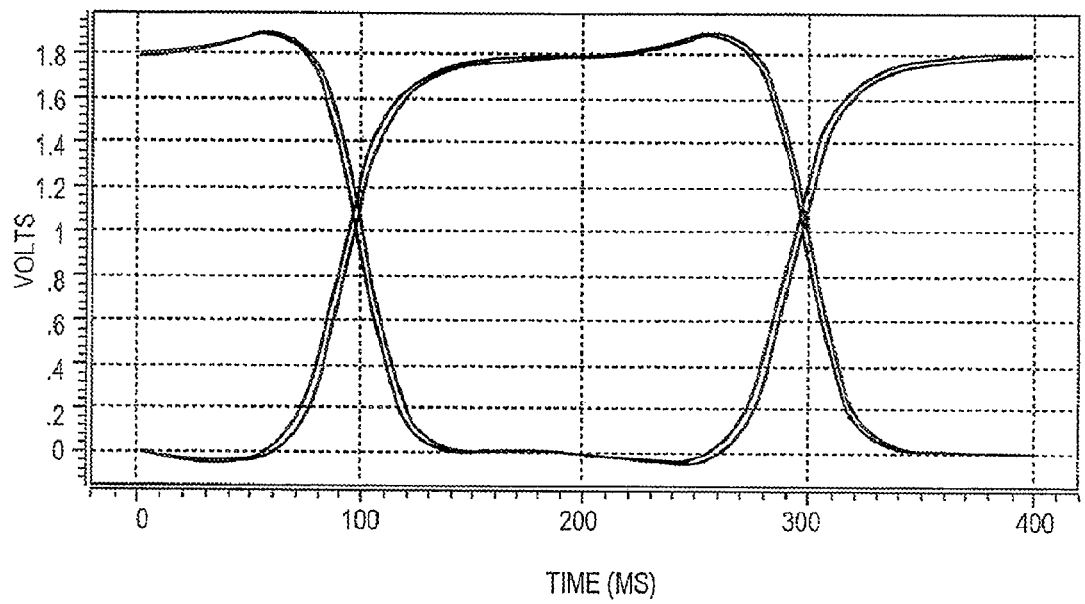
FIG. 3 is a representation of the "data eye" of the output of the circuit of FIG. 1.
Figure 4:
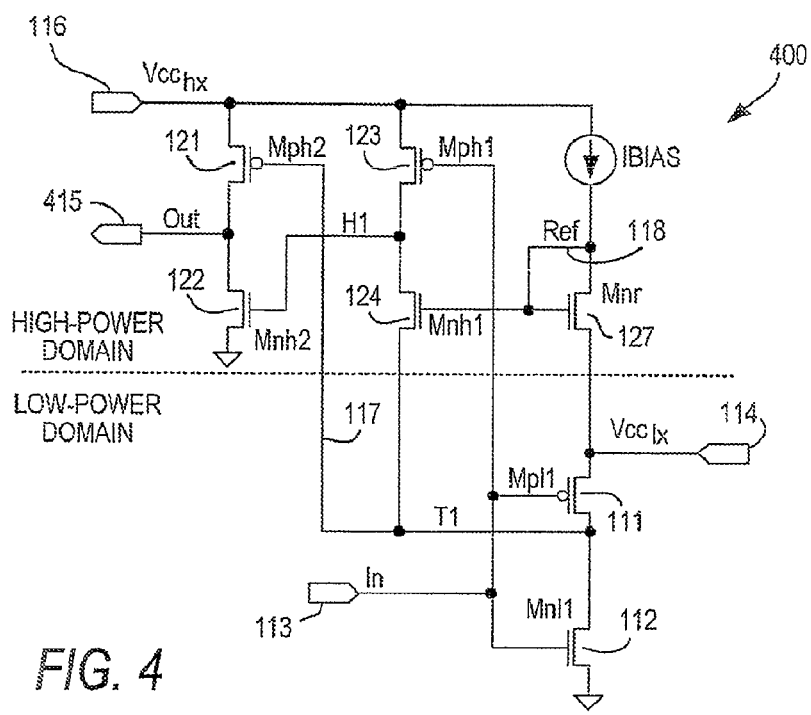
FIG. 4 is a schematic diagram of a preferred embodiment of a single-ended level-shifting circuit in accordance with the present invention.

The effect of the bottleneck can be seen in FIGS. 2 and 3. FIG. 2 shows the "T1" and "H1" signal waveforms at a data rate of 8 Gbps, using a PRBS7 (7-bit pseudorandom binary sequence) input data pattern at "In." A PRBS data pattern will stress circuit 100 and show any pattern dependency. As can be seen in FIG. 2, "H1" cannot discharge fast enough. It discharges after "T1" and is pattern dependent. The jitter resulting from that pattern dependency can be seen in the output data eye diagram of FIG. 3.

The present invention reduces the jitter in level-shifting circuitry 400 (FIG. 4) by reducing the loading on the H1 signal by using it to drive transistor 122 ("Mnh2") but not transistor 121 ("Mph2"). This is possible because, as seen in FIG. 2, although it does not reach the same voltage level as the H1 signal, the T1 signal switches at the same time as the H1 signal. Therefore, in accordance with the present invention, transistor 121 ("Mph2") is not driven by signal 128 ("H1") but by signal 117 ("T1"). Transistors 121, 122 remain in their source-to-drain configuration as in FIG. 1, but can no longer be considered to be in an inverter configuration 125 because they are not gated by the same signal. Circuitry 400 preferably is otherwise substantially identical to circuitry 100.

Figure 5:
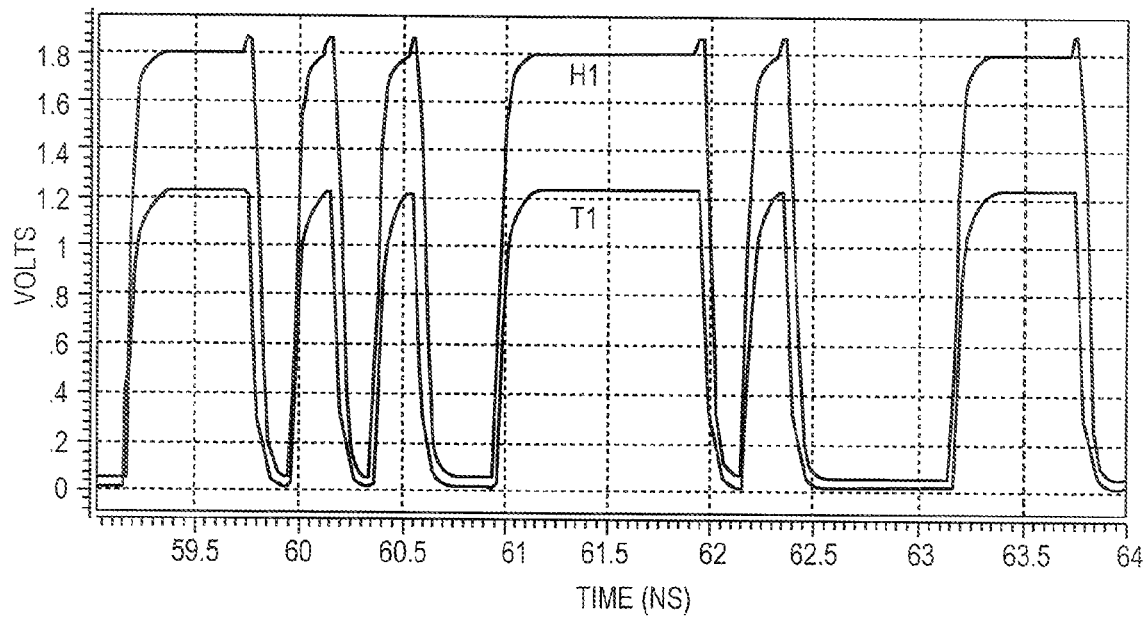
FIG. 5 is a representation, similar to FIG. 2, of the waveforms of two signals in the circuit of FIG. 4.
Figure 6:
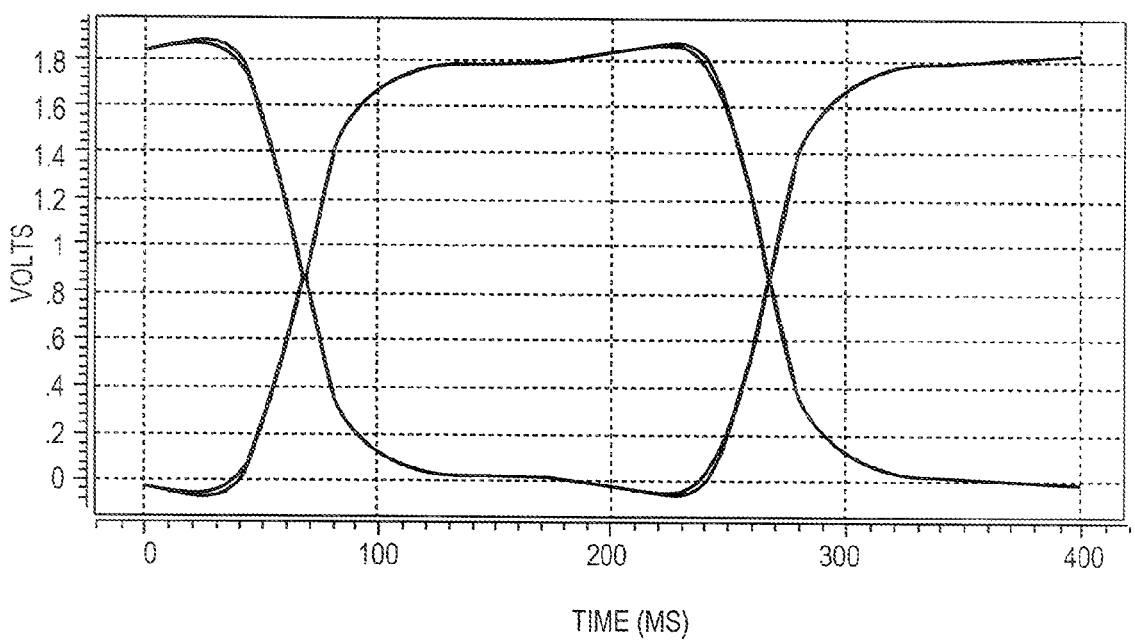
FIG. 6 is a representation of the "data eye" of the output of the circuit of FIG. 4.

Because the timing of the T1 signal is substantially identical to that of the H1 signal, the operation of circuitry 400 is substantially identical to that of circuitry 100, except that it is not affected by heavy loading on H1, which is not present in circuitry 400. FIGS. 5 and 6 correspond, for circuitry 400, to FIGS. 2 and 3 for circuitry 100. As can be seen from FIG. 5, in circuitry 400, "H1" can switch fast enough to fully high or fully low at an 8 Gbps data rate, while the data eye diagram of FIG. 6 shows very little jitter at the level-shifted output 415.

Figure 7:
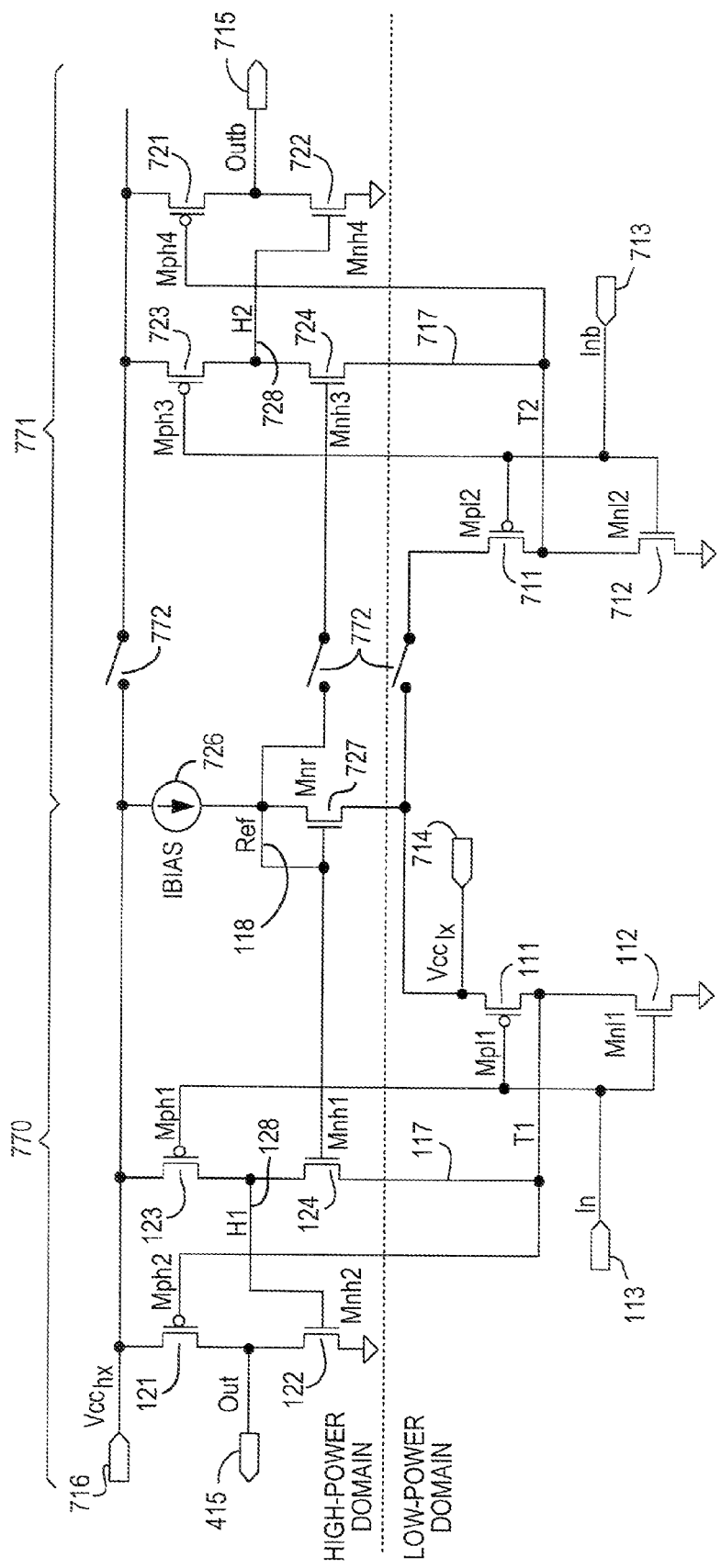
FIG. 7 is a schematic diagram of a preferred embodiment of a differential level-shifting circuit in accordance with the present invention.

To accommodate differential signalling, differential level-shifting circuitry 700 can be provided as shown in FIG. 7. "High-side" circuitry 770 is substantially identical to circuitry 400, while "low-side" circuitry 771 is a mirror-image of circuitry 400/770. Circuitry 770, 771 share high-power supply 716 ($V_{CChx}$), low-power supply 714, bias current generator 726 and diode 727 ("Mnr") (similar to bias current generator 126 and diode 127), which feed both transistor 124 ("Mnh1") and transistor 724 ("Mnh3"). Output transistors 721, 722 are driven by signals 717 ("T2") and 728 ("H2"), respectively. Differential input to circuitry 700 is on inputs 113, 713, while the differential output is on outputs 415, 715.

Figure 8:
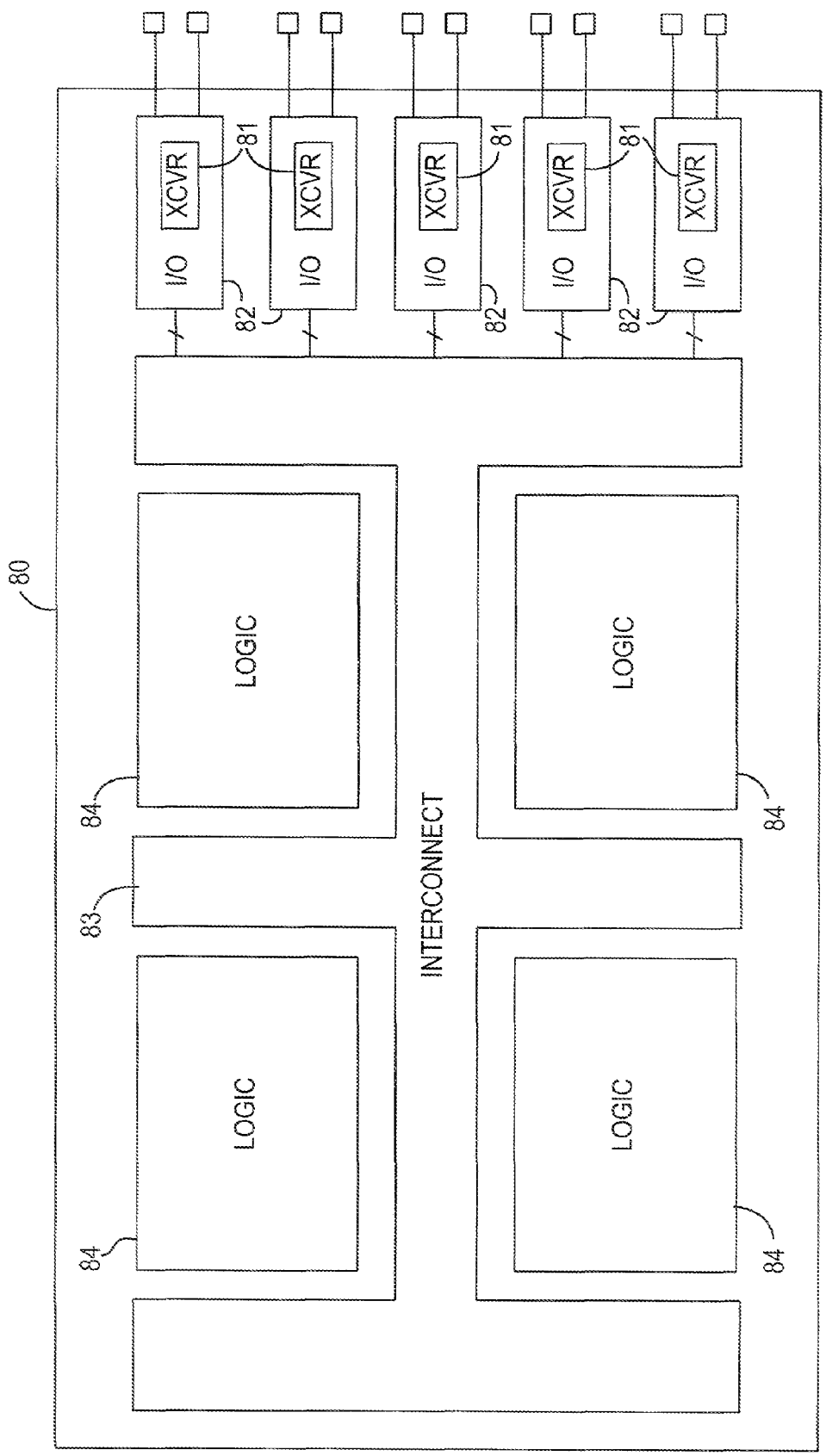
FIG. 8 is a simplified block diagram of a programmable logic device incorporating a transceiver in accordance with the present invention.

Circuitry 400 or 700 may be part of a transceiver 81 in a PLD 80 (FIG. 8). Each transceiver 81 preferably is part of an input/output (I/O) block 82, with PLD 80 preferably having a plurality of I/O blocks 82 preferably on the periphery of PLD 80. I/O blocks 82 preferably connect via programmable interconnect 83 to programmable logic regions 84.

For maximum flexibility, each transceiver 81 in PLD 80 could include circuitry 700 so that a user would have the option of programming transceiver 81 to be either differential or single-ended. In the single-ended case, "low-side" circuitry 771 is not used, and preferably may be programmably disconnected or deactivated (e.g., by programmably opening switches 772). Alternatively, some transceivers 81 could be designated for differential use and provided with circuitry 700, while other transceivers 81 could be designated for single-ended use and provided with circuitry 400.

Thus it is seen that level-shifting circuitry that is less susceptible to jitter at high data rates, and that therefore has greater bandwidth, has been provided.

Figure 9:
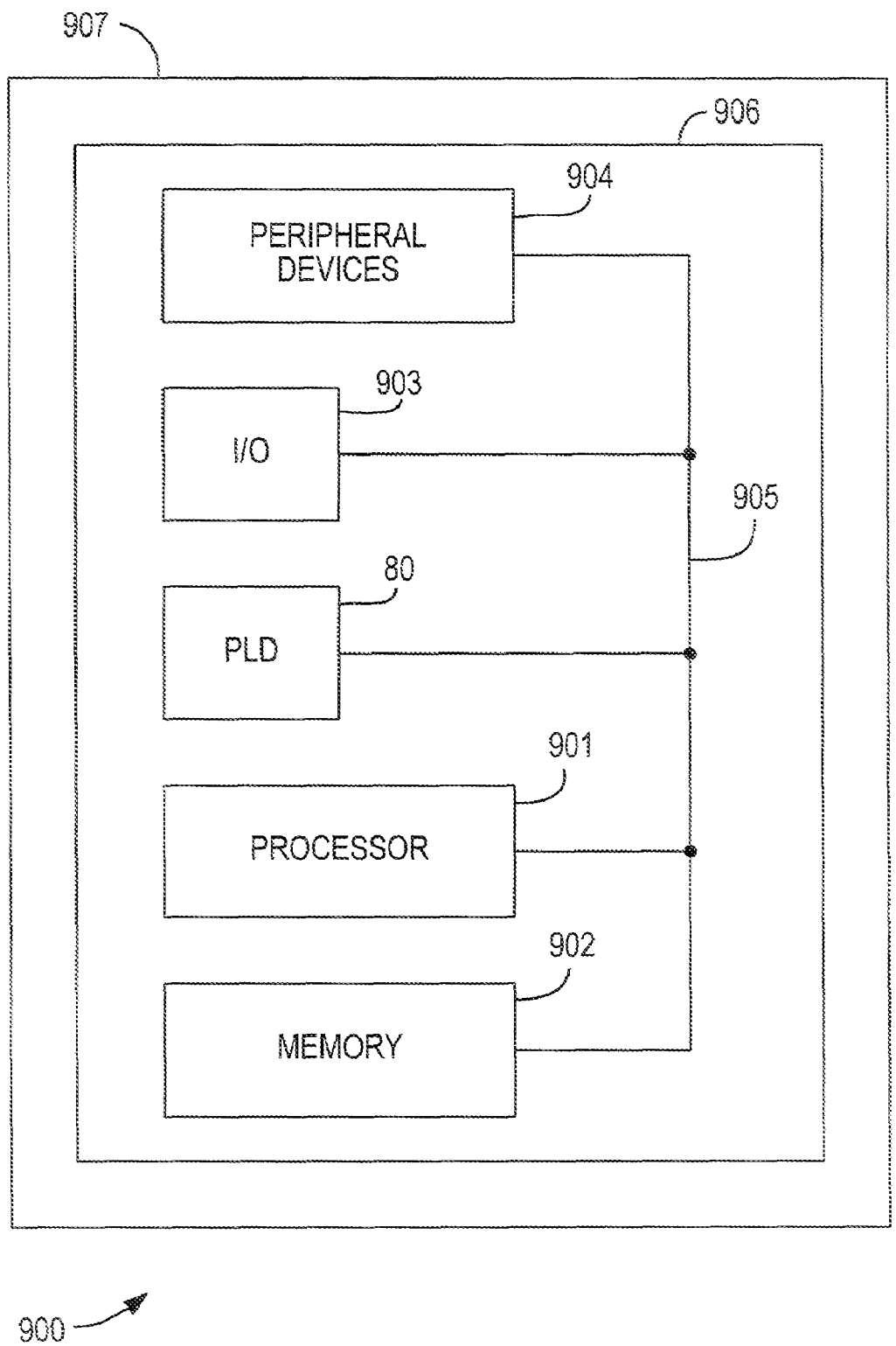
FIG. 9 is a simplified block diagram of an illustrative system employing a programmable logic device incorporating a transceiver in accordance with the present invention.

A PLD 80 incorporating the present invention may be used in many kinds of electronic devices. One possible use is in a data processing system 900 shown in FIG. 9. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 80 can be used to perform a variety of different logic functions. For example, PLD 80 can be configured as a processor or controller that works in cooperation with processor 901. PLD 80 may also be used as an arbiter for arbitrating access to shared resources in system 900. In yet another example, PLD 80 can be configured as an interface between processor 901 and one of the other components in system 900. It should be noted that system 900 is only exemplary, and that the true scope and spirit of the invention should be indicated by the following claims.

Various technologies can be used to implement PLDs 80 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A level-shifting circuit for accepting an input signal at a first power-supply level and providing said input signal as an output signal at a second power-supply level higher than said first power-supply level, said level-shifting circuit comprising:
    a first power supply at said first power-supply level;
    a second power supply at said second power-supply level;
    a first complementary transistor pair arranged as an inverter between said first power supply and ground, accepting as an input said input signal, and providing as a first intermediate signal said input signal inverted;
    a second complementary transistor pair connected in source-to-drain configuration between said second power supply and said first intermediate signal, a first transistor of said second complementary transistor pair being gated by a reference signal and a second transistor of said second complementary transistor pair being gated by said input signal, said second complementary transistor pair providing a second intermediate output at their common connection; and
    a third complementary transistor pair arranged in source-to-drain configuration between said second power supply and ground, a first transistor of said third complementary transistor pair being gated by said first intermediate signal and a second transistor of said third complementary transistor pair being gated by said second intermediate signal, said third complementary transistor pair providing said output signal at their common connection.

2. The level-shifting circuit of claim 1 wherein said reference signal is provided by a bias current generator and a diode in series between said second power supply and said first power supply.

3. The level-shifting circuit of claim 1 wherein each of said complementary transistor pairs comprises a respective n-channel transistor and a respective p-channel transistor.

4. The level-shifting circuit of claim 3 wherein:
    in said second complementary transistor pair, said first transistor is said n-channel device and said second transistor is said p-channel device; and in said third complementary transistor pair, said first transistor is said p-channel device and said second transistor is said n-channel device.

5. The level-shifting circuit of claim 1 comprising two each of said first complementary transistor pair, said second complementary transistor pair and said third complementary transistor pair; wherein:
   one each of said first, second and third complementary transistor pairs are connected as defined by claim 1 to form a first differential portion;
   another one each of said first, second and third complementary transistor pairs are connected as defined by claim 1 to form a second differential portion;
   said first and second differential portions share said first power supply, said second power supply and said reference signal;
   said inputs of said first and second differential portions form differential inputs of said level-shifting circuit; and
   said outputs of said first and second differential portions form differential outputs of said level-shifting circuit.

6. A programmable logic device comprising a serial interface having a level-shifting circuit as defined in claim 5.

7. The programmable logic device of claim 6 wherein said level-shifting circuit is programmably selectable between being single-ended and being differential.

8. The programmable logic device of claim 7 wherein one of said first and second differential portions is programmably disconnectable from said level-shifting circuit.

9. A digital processing system comprising:
   processing circuitry;
   a memory coupled to said processing circuitry; and
   a programmable logic device as defined in claim 7 coupled to the processing circuitry and the memory.

10. A printed circuit board on which is mounted a programmable logic device as defined in claim 7.

11. The printed circuit board defined in claim 10 further comprising:
    memory circuitry mounted on the printed circuit board and coupled to the programmable logic device.

12. The printed circuit board defined in claim 11 further comprising:
    processing circuitry mounted on the printed circuit board and coupled to the memory circuitry.

13. A differential level-shifting circuit for accepting a differential input signal at a first power-supply level and providing said input signal as an output signal at a second power-supply level higher than said first power-supply level, said differential level-shifting circuit comprising:
    a first power supply at said first power-supply level;
    a second power supply at said second power-supply level; and
    first and second differential level-shifting portions, each of said first and second differential level-shifting portions comprising:
    a first complementary transistor pair arranged as an inverter between said first power supply and ground, accepting as an input said input signal, and providing as a first intermediate signal said input signal inverted,
    a second complementary transistor pair connected in source-to-drain configuration between said second power supply and said first intermediate signal, a first transistor of said second complementary transistor pair being gated by a reference signal and a second transistor of said second complementary transistor pair being gated by said input signal, said second complementary transistor pair providing a second intermediate output at their common connection, and
    a third complementary transistor pair arranged in source-to-drain configuration between said second power supply and ground, a first transistor of said third complementary transistor pair being gated by said first intermediate signal and a second transistor of said third complementary transistor pair being gated by said second intermediate signal, said third complementary transistor pair providing said output signal at their common connection; wherein:
    said inputs of said first and second differential level-shifting portions form differential inputs of said level-shifting circuit; and
    said outputs of said first and second differential portions form differential outputs of said level-shifting circuit.

14. The differential level-shifting circuit of claim 13 wherein said first and second differential level-shifting portions share said first power supply, said second power supply and said reference signal.

15. The differential level-shifting circuit of claim 13 wherein said reference signal is provided by a bias current generator and a diode in series between said second power supply and said first power supply.

16. The differential level-shifting circuit of claim 15 wherein said first and second differential level-shifting portions share said first power supply, said second power supply, said bias current generator and said diode.

17. The differential level-shifting circuit of claim 13 wherein each of said complementary transistor pairs comprises a respective n-channel transistor and a respective p-channel transistor.

18. The differential level-shifting circuit of claim 17 wherein:
    in said second complementary transistor pair, said first transistor is said n-channel device and said second transistor is said p-channel device; and
    in said third complementary transistor pair, said first transistor is said p-channel device and said second transistor is said n-channel device.

19. A level-shifting circuit for accepting an input signal at a first power-supply level and providing said input signal as an output signal at a second power-supply level higher than said first power-supply level, said level-shifting circuit comprising:
    input circuitry operating in a low-power domain at said first power supply level, said input circuitry accepting said input signal and providing a low-power domain output signal that is substantially inverse to said input signal; and
    output circuitry operating in a high-power domain between said second power supply level and said low-power domain output signal, said output circuitry accepting said input signal and said low-power domain output signal to provide an intermediate high-power domain signal, said output circuitry having a final output stage gated by said intermediate high-power domain signal and by said low-power domain output signal.

20. The level-shifting circuit of claim 19 further comprising:
    a first power supply at said first power-supply level;
    a second power supply at said second power-supply level;
    a reference signal generator between said second power supply and said first power supply.

21. The level-shifting circuit of claim 20 wherein said reference signal generator comprises a bias current generator and a diode.

22. The level-shifting circuit of claim 20 wherein:
said input circuitry is mirrored to provide differential inputs to said level-shifting circuit; and
said output circuitry is mirrored to provide differential outputs of said level-shifting circuit.

23. A programmable logic device comprising a serial interface having a level-shifting circuit as defined in claim 19.

24. The programmable logic device of claim 23 wherein said level-shifting circuit is programmably selectable between being single-ended and being differential.

25. A digital processing system comprising:
processing circuitry;
a memory coupled to said processing circuitry; and
a programmable logic device as defined in claim 24 coupled to the processing circuitry and the memory.

26. A printed circuit board on which is mounted a programmable logic device as defined in claim 19.

27. The printed circuit board defined in claim 26 further comprising:
memory circuitry mounted on the printed circuit board and coupled to the programmable logic device.

28. The printed circuit board defined in claim 27 further comprising:
processing circuitry mounted on the printed circuit board and coupled to the memory circuitry.

* * * * *